United States Patent
Shen et al.

(10) Patent No.: US 9,532,480 B2
(45) Date of Patent: Dec. 27, 2016

(54) SERVER

(71) Applicants: Inventec (Pudong) Technology Corporation, Shanghai (CN); INVENTEC CORPORATION, Taipei (TW)

(72) Inventors: Yu-Long Shen, Shanghai (CN); Ji-Peng Xu, Shanghai (CN); Ming-Gang Li, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 14/845,954

(22) Filed: Sep. 4, 2015

(65) Prior Publication Data
US 2016/0165742 A1    Jun. 9, 2016

(30) Foreign Application Priority Data
Dec. 4, 2014 (CN) .......................... 2014 1 0729337

(51) Int. Cl.
*H05K 7/14* (2006.01)
*G06F 1/18* (2006.01)

(52) U.S. Cl.
CPC ............. *H05K 7/1487* (2013.01); *G06F 1/184* (2013.01); *G06F 1/187* (2013.01)

(58) Field of Classification Search
CPC ......... G06F 1/184; G06F 1/187; H05K 7/1487
See application file for complete search history.

(56) References Cited

U.S. PATENT DOCUMENTS

| 6,088,224 | A  | * | 7/2000  | Gallagher | G06F 1/184 165/104.33 |
| 6,392,884 | B1 | * | 5/2002  | Chou      | G06F 1/184 360/98.01  |
| 6,459,571 | B1 | * | 10/2002 | Carteau   | G06F 1/184 312/35     |
| 6,816,368 | B2 | * | 11/2004 | Yokosawa  | G11B 33/126 361/679.33 |
| 7,042,720 | B1 | * | 5/2006  | Konshak   | G06F 13/409 361/679.33 |
| 7,362,565 | B2 | * | 4/2008  | Imblum    | G06F 1/184 361/679.33 |
| 7,710,718 | B2 | * | 5/2010  | Merkin    | G06F 1/206 361/679.33 |

(Continued)

*Primary Examiner* — Adrian S Wilson
(74) *Attorney, Agent, or Firm* — Maschoff Brennan

(57) ABSTRACT

A server includes a chassis, a transfer board, a hard disk drive cage, two hard disk drive trays, two mother board trays, two mother boards, first hard disk drives and second hard disk drives. The chassis has an accommodation space. The transfer board is disposed on the first side plate and the second side plate to divide the accommodation space into a first accommodation region and a second accommodation region. The hard disk drive cage is located in the first accommodation region. The hard disk drive cage includes storage sections for disposing the first hard disk drives. The two hard disk drive trays for disposing the second hard disk drives are located in the second accommodation region and insert into the transfer board. All the two hard disk drive trays and the two mother board trays are randomly arranged in rows and columns and insert into the transfer board.

10 Claims, 8 Drawing Sheets

(56) References Cited

U.S. PATENT DOCUMENTS

| | | | | |
|---|---|---|---|---|
| 7,719,834 | B2 * | 5/2010 | Miyamoto | G06F 1/187 |
| | | | | 312/223.2 |
| 7,864,519 | B2 * | 1/2011 | Lin | G11B 33/128 |
| | | | | 361/679.33 |
| 8,014,144 | B2 * | 9/2011 | Cheng | G06F 1/187 |
| | | | | 361/679.33 |
| 2002/0089823 | A1 * | 7/2002 | Chin | G06F 1/20 |
| | | | | 361/679.33 |
| 2003/0147220 | A1 * | 8/2003 | Fairchild | G06F 1/184 |
| | | | | 361/726 |
| 2008/0037209 | A1 * | 2/2008 | Niazi | G06F 1/181 |
| | | | | 361/727 |
| 2009/0109609 | A1 * | 4/2009 | Lai | G06F 1/187 |
| | | | | 361/679.39 |
| 2010/0118483 | A1 * | 5/2010 | Kurokawa | G06F 1/187 |
| | | | | 361/679.33 |
| 2011/0043994 | A1 * | 2/2011 | Cheng | G06F 1/187 |
| | | | | 361/679.33 |

\* cited by examiner

SERVER

CROSS-REFERENCE TO RELATED APPLICATIONS

This non-provisional application claims priority under 35 U.S.C. §119(a) on Patent Application No(s). 201410729337.6 filed in China on Dec. 4, 2014, the entire contents of which are hereby incorporated by reference.

BACKGROUND

Technical Field

The disclosure relates to a server, more particularly to a server having two hark disk drive trays and two mother board trays that are randomly arranged in rows and columns.

Description of the Related Art

The parts of a server include a central processing unit (CPU), a memory and an input/output (I/O) device, and these components are connected to each other by buses.

The hard disk drives usually are disposed in a cage of the server. Since a requirement of tremendous data storage, it is necessary to expand the number of the hard disk drives to increase all data storage capacities. However, the cage in the server is unable to provide extra amount of space for accommodating the hard disk drives. Therefore, the servers are developed to increase extra amount of space for accommodating more hard disk drives.

SUMMARY

According to the disclosure, a server comprises a chassis, a transfer board, a hard disk drive cage, two hard disk drive trays, two mother board trays, two mother boards, a plurality of first hard disk drives and a plurality of second hard disk drives. The chassis comprises a bottom plate, a first side plate and a second side plate. The first side plate and the second side plate both stand on two sides of the bottom plate, respectively. The first side plate and the second side plate together form an accommodation space therein. The transfer board has two ends that are opposite to each other, and the two ends are disposed on the first side plate and the second side plate, respectively, so as to divide the accommodation space into a first accommodation region and a second accommodation region. The transfer board comprises an electrical connection part. The hard disk drive cage is located in the first accommodation region. The hard disk drive cage comprises a plurality of storage sections. The two hard disk drive trays are located in the second accommodation region. The two hard disk drive trays are detachably inserted into the electrical connection part of the transfer board. The two mother board trays are located in the second accommodation region. The two mother disk trays are detachably inserted into the electrical connection part of the transfer board so as to be electrically connected to the two hard disk drive trays by the transfer board. The two mother boards are disposed on the two mother board trays, respectively. The first hard disk drives are disposed in the storage sections of the hard disk drive cage. The second hard disk drives are disposed on the two hard disk drive trays. All of the hard disk drive trays and the mother board trays are arranged in an array, and are interchangeably inserted to the electrical connection part.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

Figure 1:
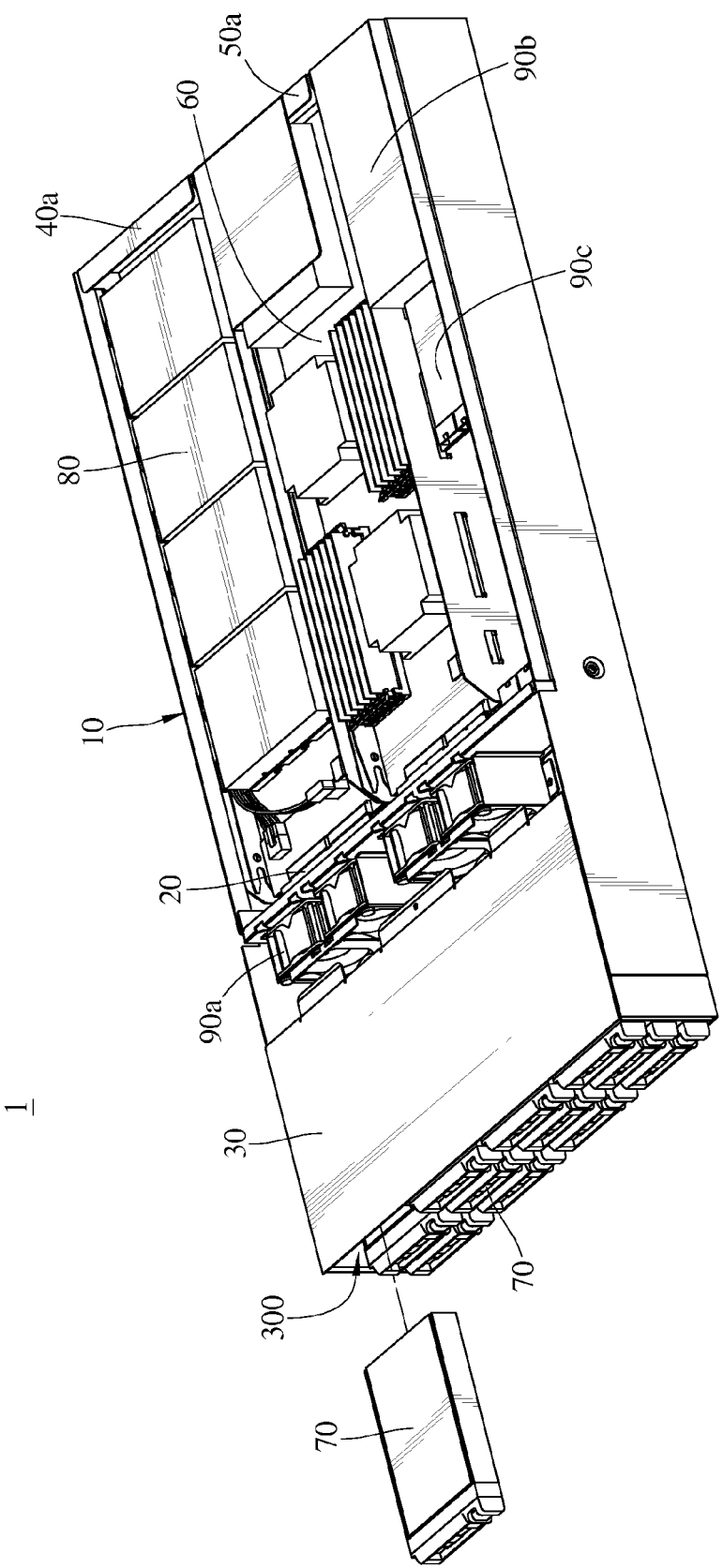
FIG. 1 is a perspective of a server according to an embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
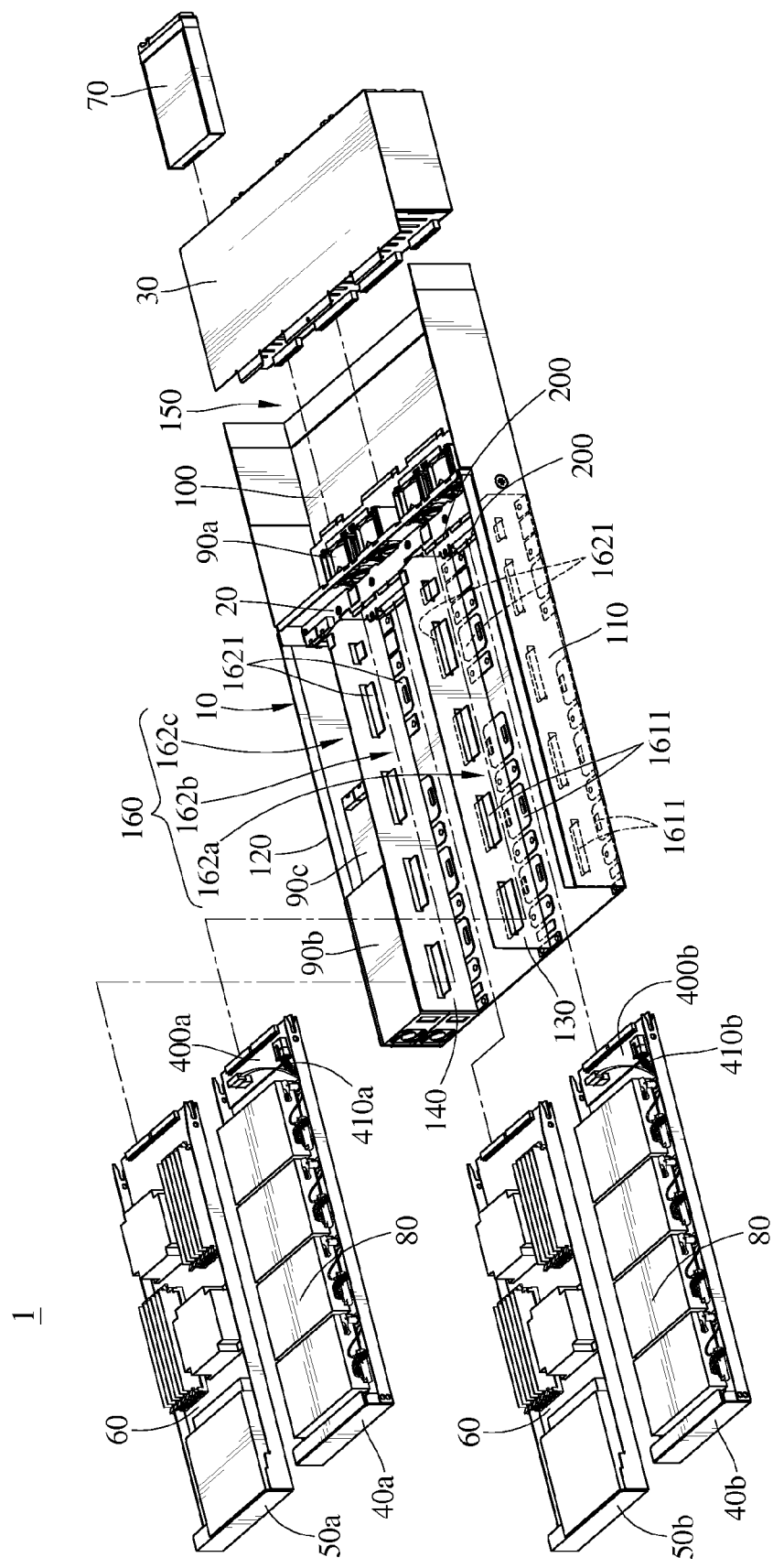
FIG. 2 is an exploded view of the server in FIG. 1.
Figure 3:
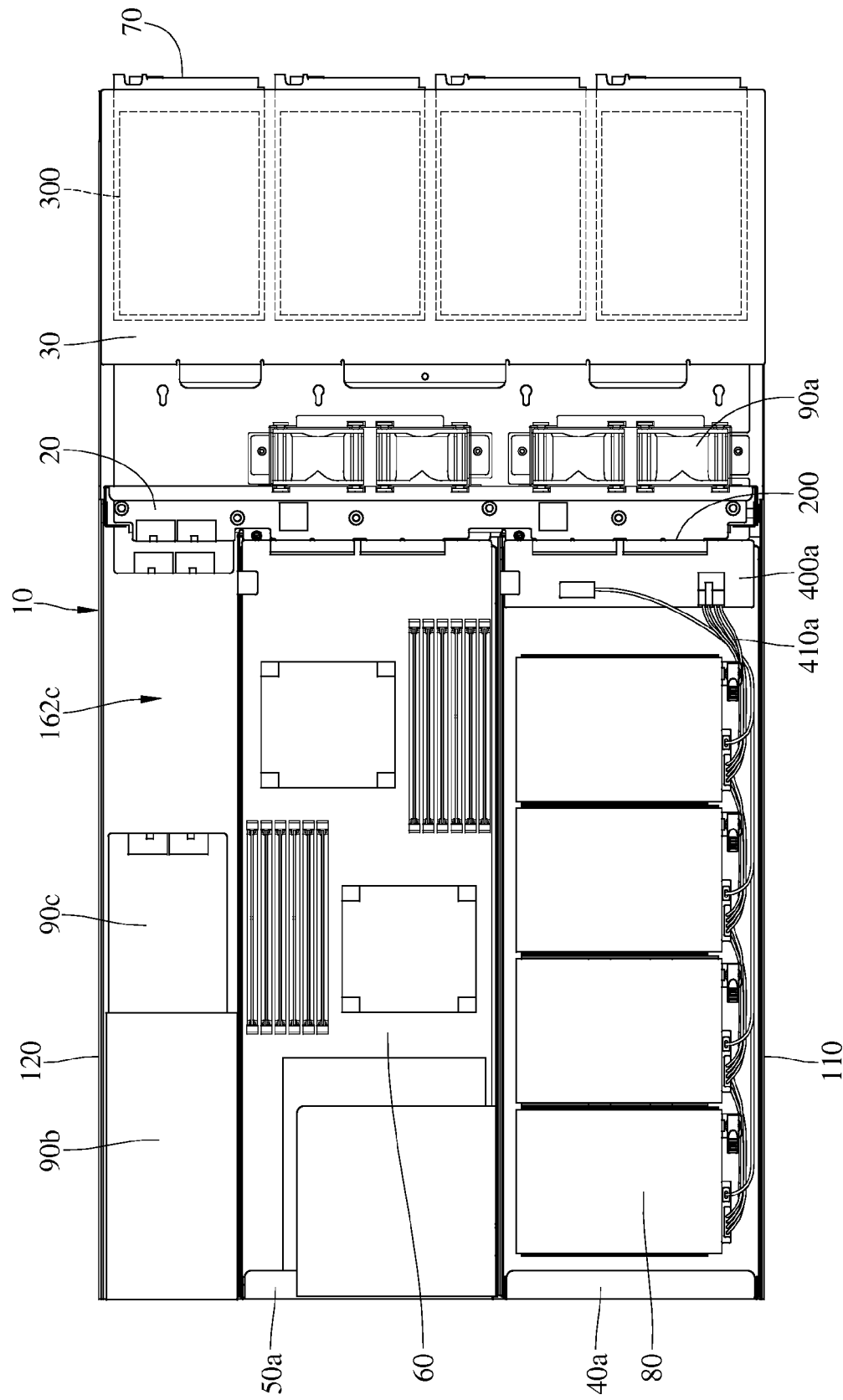
FIG. 3 is a top view of the server in FIG. 1.

Please refer to FIG. 1 to FIG. 3. FIG. 1 is a perspective of a server according to an embodiment. FIG. 2 is an exploded view of the server in FIG. 1. FIG. 3 is a top view of the server in FIG. 1. In this embodiment, a server 1 comprises a chassis 10, a transfer board 20, a hard disk drive cage 30, a first hard disk drive tray 40a (first HDD tray 40a), a second hard disk drive tray 40b (second HDD tray 40b), a first mother board tray 50a, a second mother board tray 50b, two mother boards 60, a plurality of first hard disk drives 70 and a plurality of second hard disk drives 80. The server 1 is, for example, a 2U (i.e., a unit of measure describes a server, and a U is 3.469 inches in height) rack server.

The chassis 10 comprises a bottom plate 100, a first side plate 110, a second side plate 120, a first partition 130 and a second partition 140. The first side plate 110 and the second side plate 120 stand on two sides of the bottom plate 100, respectively. The first side plate 110 and the second side plate 120 together form an accommodation space therein. The first partition 130 and the second partition 140 both stand on the bottom plate 100 and are parallel to the first side plate 110 and the second side plate 120. The first partition 130 is located between the first side plate 110 and the second side plate 120. The second partition 140 is located between the first partition 130 and the second side plate 120.

The transfer board 20 comprises an electrical connection part 200. In this embodiment, the transfer board 20 is composed through two printed circuit boards electrically connected to each other, and one of the two printed circuit boards is superposed onto the other one. The electrical connection part 200 is, for example, a plurality of slots located on the two circuit boards. Two ends of the transfer board 20 that are opposite to each other are disposed on the first side plate 110 and the second side plate 120, respectively, so that the transfer board 20 divide the accommodation space into a first accommodation region 150 and a second accommodation region 160. The first partition 130 and the second partition 140 are both located in the second accommodation region 160. Both the first partition 130 and the second partition 140 divide the second accommodation region 160 into a first accommodation zone 162a, a second accommodation zone 162b and a third accommodation zone 162c. The first accommodation zone 162a is formed between the first side plate 110 and the first partition 130. The second accommodation zone 162b is formed between the first partition 130 and the second partition 140. The third accommodation zone 162c is formed between the second side plate 120 and the second partition 140.

Each of the first partition 130 and the first side plate 110 has two first sliding rails 1611 located in the first accommodation zone 162a, and a position of the first sliding rail 1611 of the first partition 130 corresponds to a position of the first sliding rail 1611 of the first side plate 110. Each of the first partition 130 and the second partition 140 has two second sliding rails 1621 located in the second accommodation zone 162b. A position of the second sliding rail 1621 of the first partition 130 corresponds to a position of the second sliding rail 1621 of the second partition 140.

The hard disk drive cage 30 comprises a plurality of storage sections 300. Two sides of the hard disk drive cage 30 that are opposite to each other are disposed on the first side plate 110 and the second side plate 120, respectively, so that the hard disk drive cage 30 is located in the first accommodation region 150.

The first HDD tray 40a is slidably disposed on two of the first sliding rails 1611 whose positions correspond to each other. Thus, the first HDD tray 40a is located in the first accommodation zone 162a of the second accommodation region 160. The second HDD tray 40b is slidably disposed on the other two of the first sliding rails 1611 whose positions correspond to each other. Thus, the second HDD tray 40b is located in the first accommodation zone 162a, and the second HDD tray 40b is located below the first HDD tray 40a. The first HDD tray 40a and the second HDD tray 40b are detachably inserted into the electrical connection part 200 of the transfer board 20. The disclosure is not limited to the foregoing arrangement of the first HDD tray 40a and the second HDD tray 40b. The following will describe some other arrangements in detail.

The first mother board tray 50a is slidably disposed on two of the second sliding rails 1621 whose positions correspond to each other. Thus, the first mother board tray 50a is located in the second accommodation zone 162b of the second accommodation region 160. The second mother board tray 50b is slidably disposed on the other two of the second sliding rails 1621 whose positions correspond to each other. Thus, the second mother board tray 50b is located in the second accommodation zone 162b, and the second mother board tray 50b is located below the first mother board tray 50a. The first mother board tray 50a and the second mother board tray 50b are both detachably inserted into the electrical connection part 200 of the transfer board 20. The disclosure is not limited to the foregoing arrangement of first mother board tray 50a and the second mother board tray 50b. The following will describe some other arrangements in detail.

The two mother boards 60 are disposed on the first mother board tray 50a and the second mother board tray 50b, respectively. The first mother board tray 50a and the second mother board tray 50b are both inserted into the electrical connection part 200 so that the two mother boards 60 are electrically connected to the electrical connection part 200.

The first hard disk drives 70 are disposed in the storage sections 300 of the hard disk drive cage 30. Each of the first hard disk drives 70 is connected to the electrical connection part 200 so as to be electrically connected to the two mother boards 60.

Some of the hard disk drives 80 are disposed on the first HDD tray 40a, and the other of the hard disk drives 80 are disposed on the second HDD tray 40b.

Furthermore, the server 1 further comprises a cooling fan assembly 90a, a power distribution board 90b (PDB) and a fan control board 90c (FCB). The cooling fan assembly 90a is disposed between the transfer board 20 and the hard disk drive cage 30. The power distribution board 90b and the fan control board 90c are both located in the third accommodation zone 162c of the second accommodation region 160.

Moreover, in this embodiment and some other embodiments, the first HDD tray 40a comprises a circuit board 400a and a wire 410a, and the second HDD tray 40b comprises a circuit board 400b and a wire 410b. The circuit boards 400a and 400b each have a power supply (its reference numeral is omitted) and a signal transceiver (its reference numeral is omitted). The second hard disk drives 80 disposed on the first HDD tray 40a are electrically connected to the power supply part and the signal transceiver part by the wire 410a. The circuit board 400a is inserted into the electrical connection part 200 of the transfer board 20 so that the second hard disk drives 80 are electrically connected to the two mother boards 60 by the circuit board 400a and the wire 410a. The second hard disk drives 80 disposed on the second HDD tray 40b are electrically connected to the power supply part and the signal transceiver part by the wire 410b. The circuit board 400b is inserted into the electrical connection part 200 of the transfer board 20 so that the second hard disk drives 80 are electrically connected to the two mother boards 60 by the circuit board 400b and the wire 410b.

In this embodiment, the server 1 comprises a plurality of second hard disk drives 80 disposed on the first HDD tray 40a and the second HDD tray 40b, but the disclosure is not limited thereto. In other embodiments, the number of the second hard disk drives 80 disposed on the first HDD tray 40a and the second HDD tray 40b can be any positive integer. Furthermore, in this embodiment, the server 1 comprises two HDD trays and two mother board trays, but the disclosure is not limited thereto. In other embodiments, both the number of the HDD tray and that of the mother board tray can be any integer.

In this embodiment, the first HDD tray 40a, the second HDD tray 40b, the first mother board tray 50a and the second mother board tray 50b are randomly arranged in an array (rows and columns), and are interchangeably inserted to the electrical connection part 200 of the transfer board 20. In this embodiment, the HDD trays and the mother board trays are arranged in a 2×2 matrix, which is shown in FIG. 2, but the arrangement is alterable.

Figure 4:
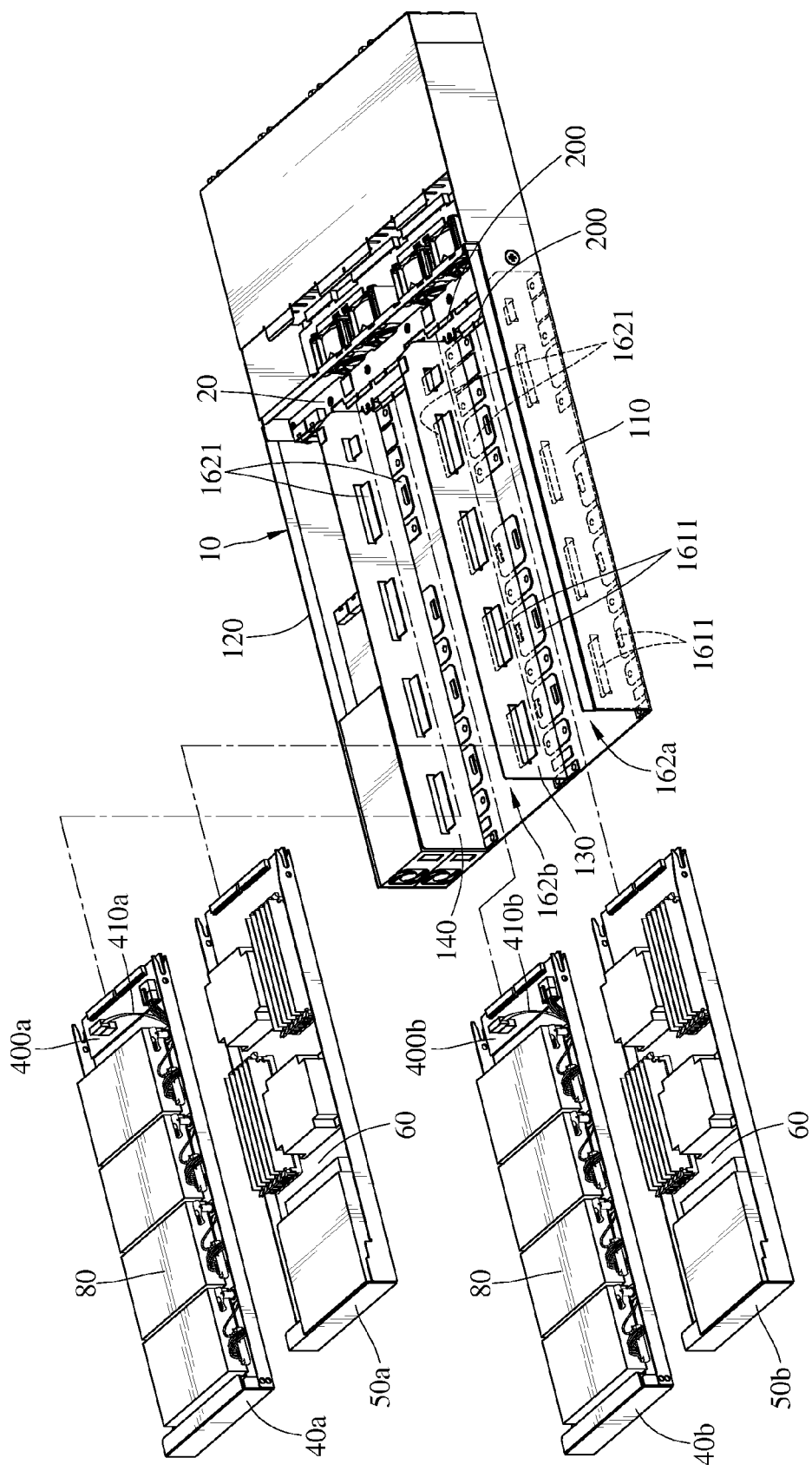
FIG. 4 is another exploded view of the server according to the embodiment.
Figure 5:
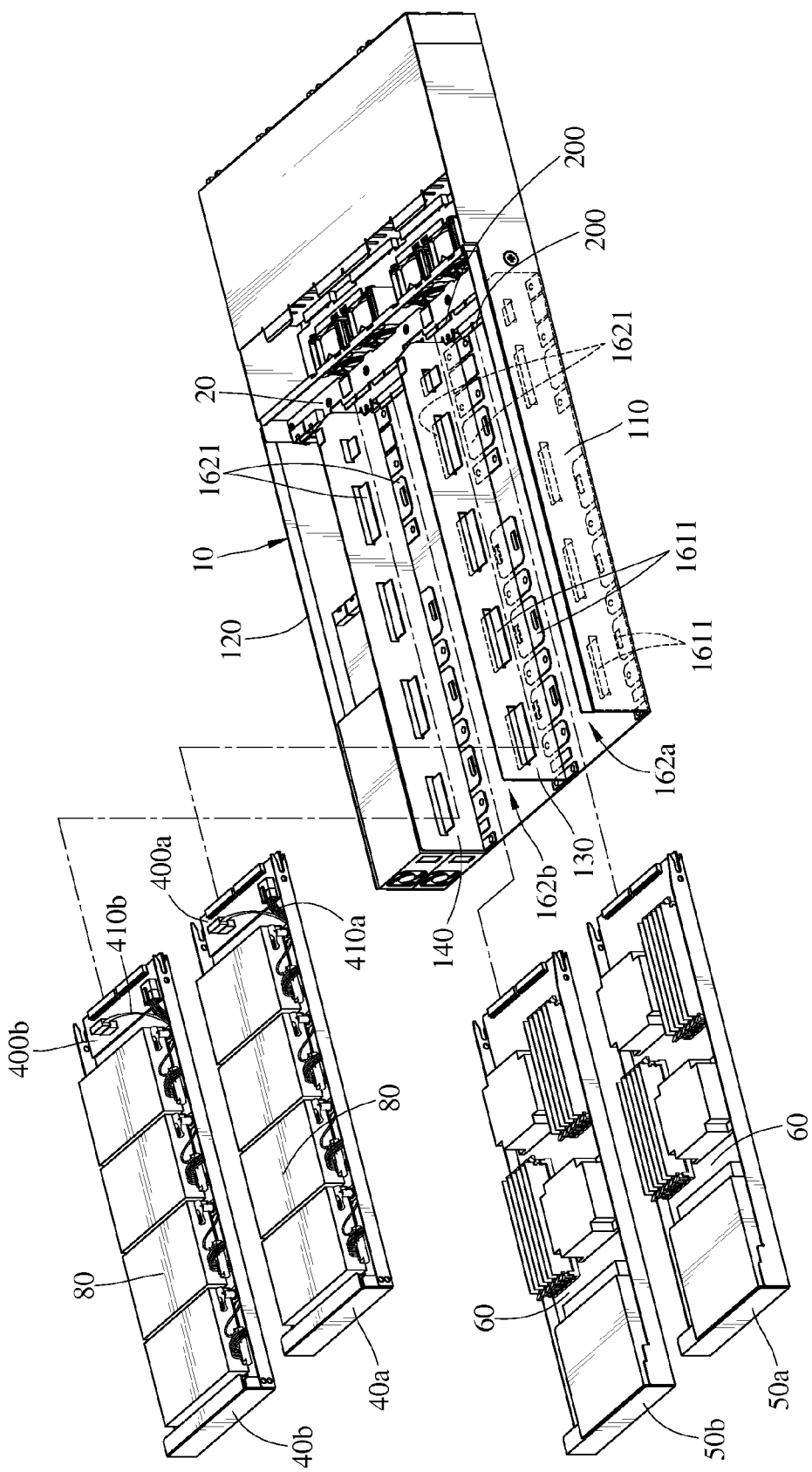
FIG. 5 is still another exploded view of the server according to the embodiment.
Figure 6:
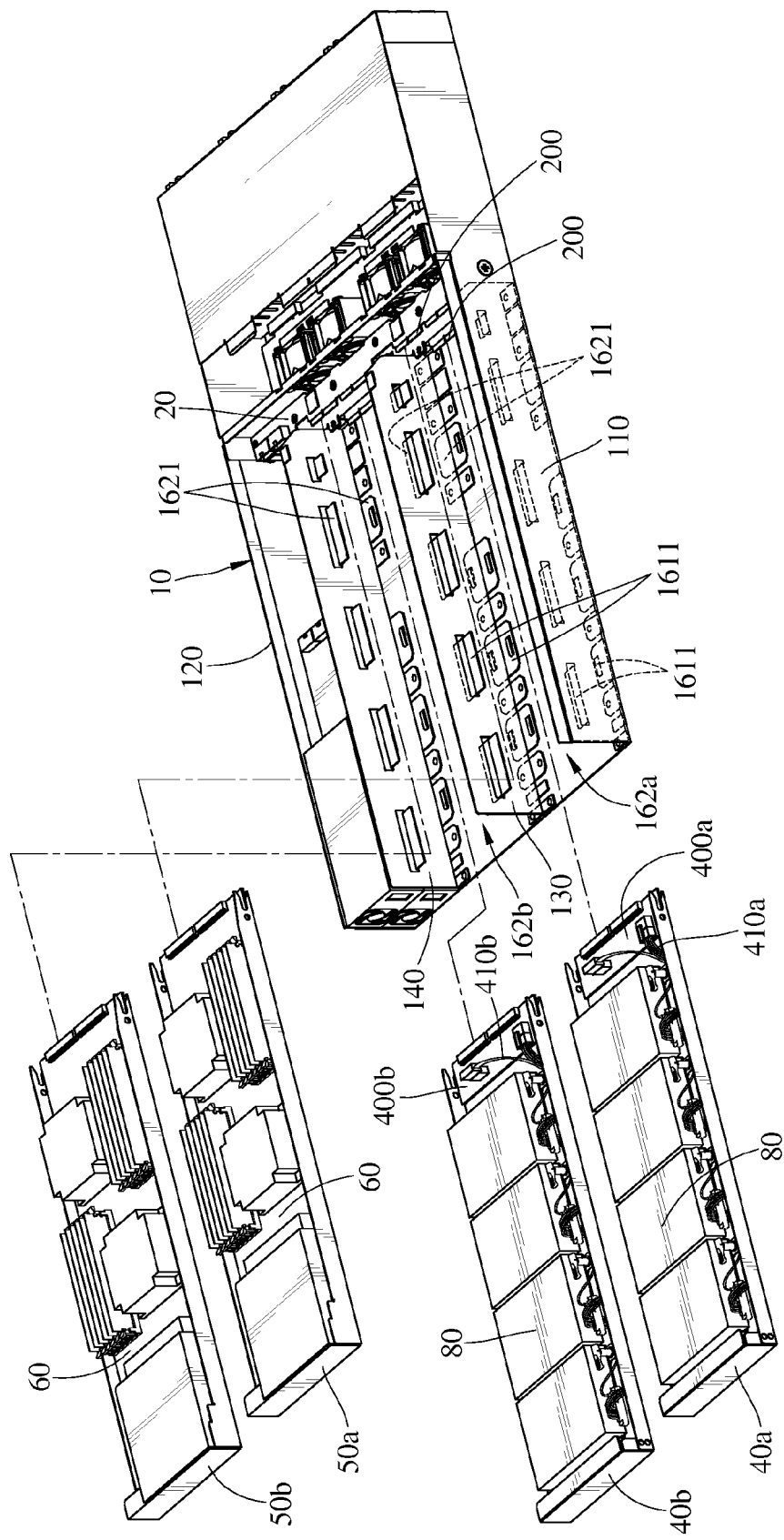
FIG. 6 is yet another exploded view of the server according to the embodiment.
Figure 7:
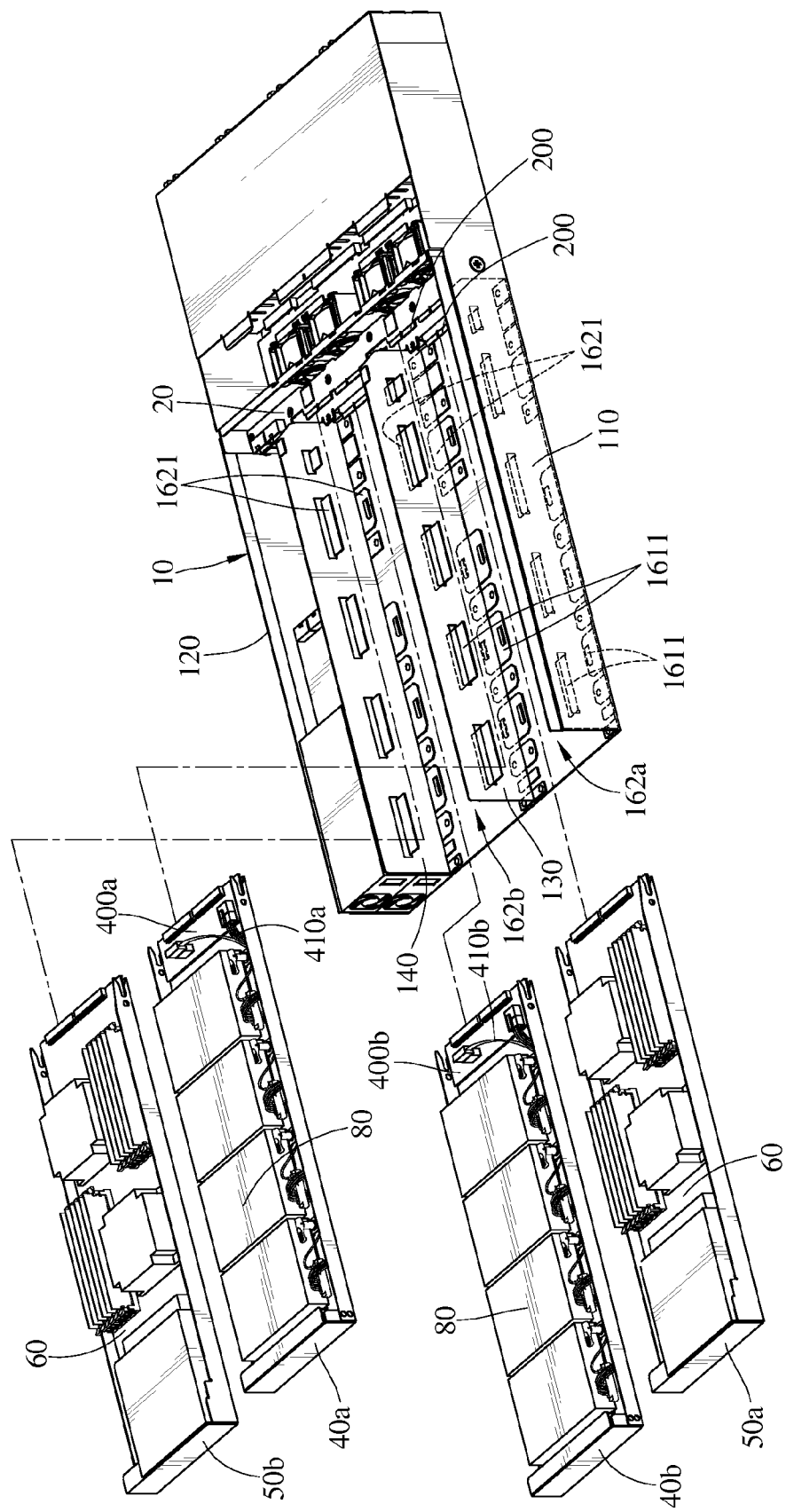
FIG. 7 is still yet another exploded view of the server according to the embodiment.
Figure 8:
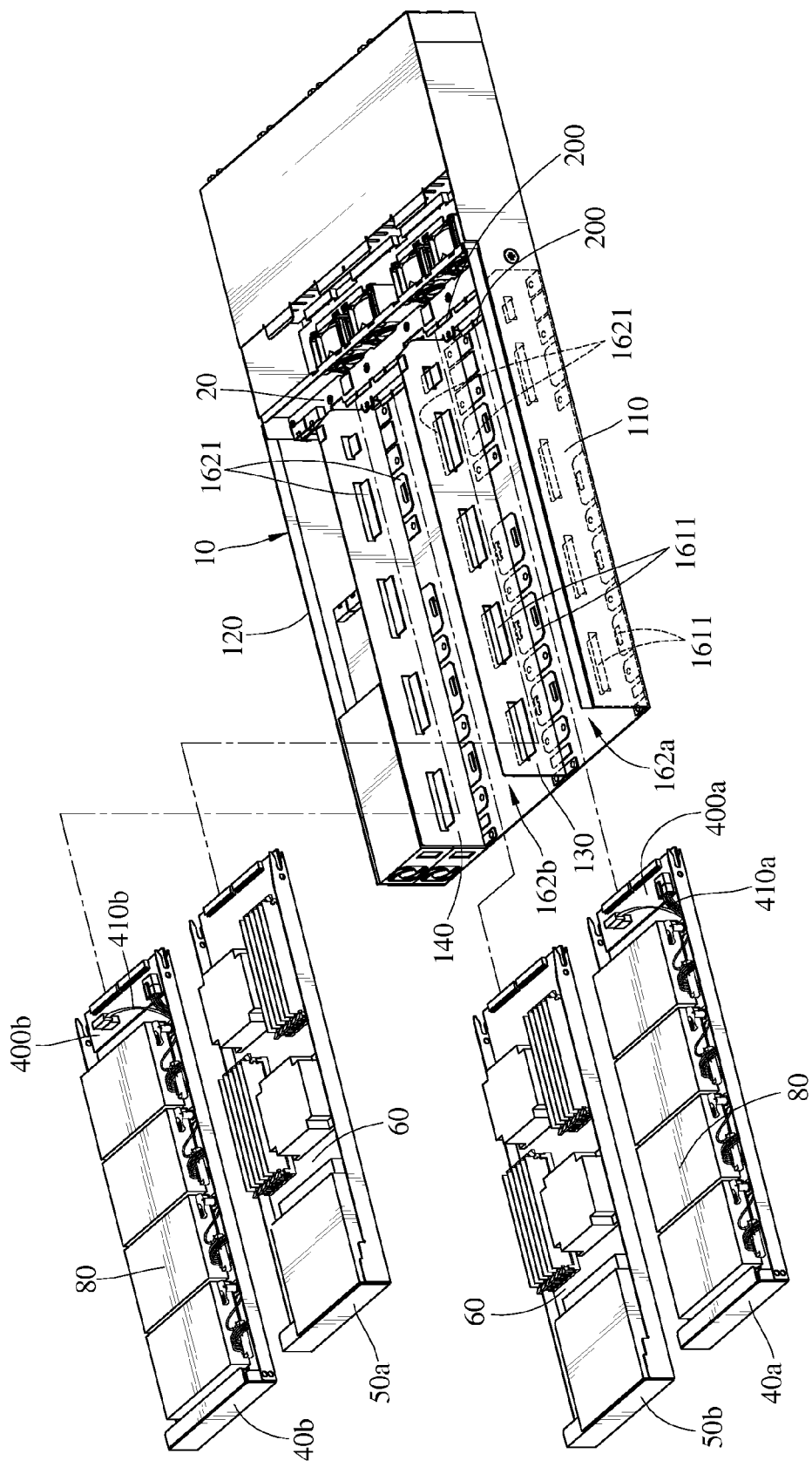
FIG. 8 is still yet another exploded view of the server according to the embodiment.

Please refer to FIG. 4 to FIG. 8. FIG. 4 is another exploded view of the server according to the embodiment. FIG. 5 is still another exploded view of the server according to the embodiment. FIG. 6 is yet another exploded view of the server according to the embodiment. FIG. 7 is still yet another exploded view of the server according to the embodiment. FIG. 8 is still yet another exploded view of the server according to the embodiment.

As seen in FIG. 4, according to another arrangement, the first HDD tray 40a is slidably disposed on two of the second sliding rails 1621 whose positions are correspond to each other. Thus, the first HDD tray 40a is located in the second accommodation zone 162b of the second accommodation region 160. The second HDD tray 40b is slidably disposed on the other two of the second sliding rails 1621 whose positions correspond to each other. Thus, the second HDD tray 40b is located in the second accommodation zone 162b, and the second HDD tray 40b is located below the first HDD tray 40a. The first mother board tray 50a is slidably disposed on two of the first sliding rails 1611 whose positions correspond to each other. Thus, the first mother board tray 50a is located in the first accommodation zone 162a. The second mother board tray 50b is slidably disposed on the other two of the first sliding rails 1611 whose positions correspond to each other. Thus, the second mother board tray 50b is located in the first accommodation zone 162a, and the second mother board tray 50b is located below the first mother board tray 50a.

As seen in FIG. 5, according to yet another arrangement, the first HDD tray 40a is slidably disposed on two of the first sliding rails 1611 so that the first HDD tray 40a is located in the first accommodation zone 162a. The second HDD tray 40b is slidably disposed on two of the second sliding rails 1621 so that the second HDD tray 40b is located in the second accommodation zone 162b. The first mother board tray 50a is slidably disposed on the other two of the first sliding rails 1611 so that the first mother board tray 50a is located in the first accommodation zone 162a, and the first mother board tray 50a is located below the first HDD tray 40a. The second mother board tray 50b is slidably disposed on the other two of the second sliding rails 1621 so that the second mother board tray 50b is located in the second accommodation zone 162b, and the second mother board tray 50b is located below the second HDD tray 40b.

As seen in FIG. 6, according to still yet another arrangement, the first HDD tray 40a is slidably disposed on two of the first sliding rails 1611 so that the first HDD tray 40a is located in the first accommodation zone 162a. The second HDD tray 40b is slidably disposed on two of the second sliding rails 1621 so that the second HDD tray 40b is located in the second accommodation zone 162b. The first mother board tray 50a is slidably disposed on the other two of the first sliding rails 1611 so that the first mother board tray 50a is located in the first accommodation zone 162a, and the first mother board tray 50a is located above the first HDD tray 40a. The second mother board tray 50b is slidably disposed on the other two of the second sliding rails 1621 so that the second mother board tray 50b is located in the second accommodation zone 162b, and the second mother board tray 50b is located above the second HDD tray 40b.

As seen in FIG. 7, according to still yet another arrangement, the first HDD tray 40a is slidably disposed on two of the first sliding rails 1611 so that the first HDD tray 40a is located in the first accommodation zone 162a. The second HDD tray 40b is slidably disposed on two of the second sliding rails 1621 so that the second HDD tray 40b is located in the second accommodation zone 162b. The first mother board tray 50a is slidably disposed on the other two of the first sliding rails 1611 so that the first mother board tray 50a is located in the first accommodation zone 162a, and the first mother board tray 50a is located below the first HDD tray 40a. The second mother board tray 50b is slidably disposed on the other two of the second sliding rails 1621 so that the second mother board tray 50b is located in the second accommodation zone 162b, and the second mother board tray 50b is located above the second HDD tray 40b.

As seen in FIG. 8, according to still yet another arrangement, the first HDD tray 40a is slidably disposed on two of the first sliding rails 1611 so that the first HDD tray 40a is located in the first accommodation zone 162a. The second HDD tray 40b is slidably disposed on two of the second sliding rails 1621 so that the second HDD tray 40b is located in the second accommodation zone 162b. The first mother board tray 50a is slidably disposed on the other two of the first sliding rails 1611 so that the first mother board tray 50a is located in the first accommodation zone 162a, and the first mother board tray 50a is located above the first HDD tray 40a. The second mother board tray 50b is slidably disposed on the other two of the second sliding rails 1621 so that the second mother board tray 50b is located in the second accommodation zone 162b, and the second mother board tray 50b is located below the second HDD tray 40b.

According to the embodiments of the disclosure, the server comprises not only hard disk drive cage being located in the first accommodation region but also the hard disk drives trays being added into the second accommodation region. In addition, all of the HDD trays and the mother board trays are randomly arranged in rows and columns (namely, arranged in a matrix manner). Therefore, it is convenience toto add more hard disk drives in the server, and all the positions of the HDD trays and the mother board trays can be easily altered. Thus, more hard disk drives are disposed to obtain more data storage capabilities.

What is claimed is:

1. A server, comprising:
   a chassis comprising a bottom plate, a first side plate and a second side plate, the first side plate and the second side plate both standing on two sides of the bottom plate, respectively, the first side plate and the second side plate together forming an accommodation space therein;
   a transfer board with two ends that are opposite to each other, the two ends of the transfer board being disposed on the first side plate and the second side plate, respectively, so as to divide the accommodation space into a first accommodation region and a second accommodation region, and the transfer board comprising an electrical connection part;
   a hard disk drive cage located in the first accommodation region and comprising a plurality of storage sections;
   two hard disk drive trays located in the second accommodation region, the two hard disk drive trays being detachably inserted into the electrical connection part of the transfer board;
   two mother board trays located in the second accommodation region, the two mother disk trays being detachably inserted into the electrical connection part of the transfer board so as to be electrically connected to the two hard disk drive trays by the transfer board;
   two mother boards disposed on the two mother board trays, respectively;
   a plurality of first hard disk drives disposed in the storage sections of the hard disk drive cage; and
   a plurality of second hard disk drives disposed in the two hard disk drive trays;
   wherein all of the hard disk drive trays and the mother board trays are arranged in an array, and are interchangeably inserted to the electrical connection part of the transfer board.

2. The server according to claim 1, wherein the chassis further comprises a first partition and a second partition both located in the second accommodation region, the first partition and the second partition both stand on the bottom plate and are parallel to the first side plate and the second side plate, both of the first partition and the second partition divide the second accommodation region into a first accommodation zone, a second accommodation zone and a third accommodation zone, the first accommodation zone is formed between the first partition and the first side plate, the second accommodation zone is formed between the first partition and the second partition, and the third accommodation zone is formed between the second partition and the second side plate.

3. The server according to claim 2, wherein the two hard disk drive trays are both located in the first accommodation zone, and the two mother board trays are both located in the second accommodation zone.

4. The server according to claim 2, wherein the two hard disk drive trays are respectively located in the first accommodation zone and the second accommodation zone, the two mother board trays are respectively located in the first accommodation zone and the second accommodation zone, and both of the two hard disk drive trays are located above or below the two mother board trays.

5. The server according to claim 2, wherein the two hard disk drive trays comprise a first hard disk drive tray and a second hard disk drive tray, the two mother board trays comprise a first mother board tray and a second mother board tray, the first hard disk drive tray and the first mother board tray are both located in the first accommodation zone, the second hard disk drive tray and the second mother board tray are both located in the second accommodation zone, the first hard disk drive tray is located above the first mother board tray, and the second hard disk drive tray is located below the second mother board tray.

6. The server according to claim 2, wherein the first partition and the first side plate each have two first sliding rails located in the first accommodation zone, the first partition and the second side plate each have two second sliding rails located in the second accommodation zone, the hard disk drive tray is slidably disposed on the first sliding rail or the second sliding rail, and the mother board tray is slidably disposed on the first sliding rail or the second sliding rail.

7. The server according to claim 2, further comprising a power distribution board (PDB) and a fan control board (FCB), wherein the power distribution board and the fan control board are both located in the third accommodation zone.

8. The server according to claim 1, wherein the two hard disk drive trays each comprise a wire and a circuit board, the circuit board has a power supply part and a signal transceiver part, the second hard disk drives are electrically connected to the power supply part and the signal transceiver part by the wire.

9. The server according to claim 1, further comprising a cooling fan assembly disposed between the hard disk drive cage and the transfer board.

10. The server according to claim 1, wherein the first hard disk drives are electrically connected to the two mother board trays by the transfer board.

* * * * *